(12) United States Patent
Gardner et al.

(10) Patent No.: US 6,268,634 B1
(45) Date of Patent: Jul. 31, 2001

(54) TRANSISTOR WITH AN ULTRA SHORT CHANNEL LENGTH DEFINED BY A LATERALLY DIFFUSED NITROGEN IMPLANT

(75) Inventors: Mark I. Gardner, Cedar Creek; H. Jim Eulford, Jr.; Charles E. May, both of Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/178,225

(22) Filed: Oct. 23, 1998

(51) Int. Cl.[7] ............ H01L 29/76; H01L 29/94; H01L 31/062; H01L 27/088; H01L 31/113

(52) U.S. Cl. ............ 257/410; 257/382; 257/408; 257/900

(58) Field of Search .................. 257/410–412, 257/408, 900, 382–384, 336, 344; 438/305, 299

(56) References Cited

U.S. PATENT DOCUMENTS

| | | | |
|---|---|---|---|
| 5,508,212 | * 4/1996 | Wang et al. | 438/305 |
| 5,554,871 | * 9/1996 | Yamashita et al. | 257/408 |
| 5,837,588 | * 11/1998 | Wu | 438/305 |
| 5,877,056 | * 3/1999 | Wu | 438/299 |

* cited by examiner

Primary Examiner—Sara Crane
Assistant Examiner—Chong Quang Nguyen
(74) Attorney, Agent, or Firm—Kevin L. Daffer; Conley, Rose & Tayon (57) ABSTRACT

A process is disclosed for fabricating a transistor having a channel length that is smaller than lengths resolvable using common photolithography techniques. A gate oxide layer is formed over a lightly doped semiconductor substrate. A gate conductor layer is then deposited over the gate oxide layer. The upper surface of the gate conductor layer includes a future conductor area laterally bounded by a spaced pair of target areas, wherein the lateral distance between the spaced pair of target areas is preferably chosen at the photolithography threshold. Nitrogen is implanted into the spaced pair of target areas to form a spaced pair of nitrogen bearing regions within the gate conductor layer, thereby defining a nitrogen free region in the gate conductor layer. A thermal anneal reduces the width of the nitrogen free region. A variable thickness oxide layer is then grown over the entire semiconductor topography and anisotropically etched to form an oxide mask over the reduced-width nitrogen free region. Portions of the gate conductor layer not covered by the oxide mask are then removed, leaving the reduced-width nitrogen free region as a gate conductor having a width below the photolithography threshold.

12 Claims, 4 Drawing Sheets

TRANSISTOR WITH AN ULTRA SHORT CHANNEL LENGTH DEFINED BY A LATERALLY DIFFUSED NITROGEN IMPLANT

BACKGROUND OF THE INVENTION

1. Field of the Invention

This invention relates generally to fabrication of integrated circuits, and more particularly to controlling the channel length of transistors by laterally diffusing a nitrogen implant.

2. Description of the Related Art

MOSFETs (metal-oxide-semiconductor-field-effect transistors) are the basic building blocks of modern integrated circuits. The conventional fabrication of MOSFET devices is well known. Typically, MOSFETs are manufactured by depositing an undoped polycrystalline silicon ("polysilicon") material over a relatively thin gate oxide arranged above a semiconductor substrate. The polysilicon material and the gate oxide are patterned to form a gate conductor arranged between a source region and a drain region. The gate conductor and source/drain regions are then implanted with an impurity dopant. If the dopant species employed for forming the source/drain regions is n-type, then the resulting MOSFET is an NMOSFET (n-channel) transistor device. Conversely, if the source/drain dopant species is p-type, then the resulting MOSFET is a PMOSFET (p-channel) transistor device. Integrated circuits utilize either n-channel devices exclusively, p-channel devices exclusively, or a combination of both on a single monolithic substrate.

The dimensions of MOSFETs play a critical role in determining the speed and complexity of integrated circuits. The complexity of an integrated circuit is a function of the number of MOSFETs that can be packed into a given substrate area. Clearly, reducing the lateral width of the gate conductor will translate into an increased transistor surface density. Decreasing the width of the gate conductor, and hence the channel length also reduces the transistor threshold voltage, $V_T$, which in turn leads to faster integrated circuits. Several factors contribute to $V_T$, one of which is the effective channel length ("$L_{eff}$") of the transistor. The initial distance between the source and the drain of a transistor is often referred to as the physical channel length. However, after implantation and subsequent diffusion of the source/drain regions, the actual distance between the source and drain becomes less than the physical channel length and is often referred to as the effective channel length, $L_{eff}$. In VLSI designs, as the physical channel length decreases, so too must $L_{eff}$. Decreasing $L_{eff}$ reduces the distance between the depletion regions associated with the source and drain of a transistor. As a result, less gate charge is required to invert the channel of a transistor having a shorter $L_{eff}$. Accordingly, reducing the physical channel length, and hence the $L_{eff}$, can lead to a reduction in the threshold voltage of a transistor. Consequently, the switching speed of the logic gates of an integrated circuit employing transistors with reduced $L_{eff}$ is faster, allowing the integrated circuit to quickly transition between logic states (i.e., operate at high frequencies).

Minimization of the physical channel length of a transistor is limited by conventional techniques used to define the gate conductor of the transistor. As transistor geometries shrink below 0.5 micron, the limitations of conventional transistor processing become more and more apparent. As previously indicated, gate conductors are typically formed from polysilicon. A technique known as optical lithography, or photolithography, is used to pattern a photosensitive film (i.e., photoresist) formed above the polysilicon material. According to this technique, an optical image is transferred to the photoresist by projecting electromagnetic radiation, typically ultraviolet light, through the transparent portions of a mask plate. The solubility of photoresist regions exposed to the radiation is altered by a photochemical reaction. The photoresist is washed with a solvent that preferentially removes the altered resist areas of higher solubility. Exposed portions of the polysilicon material not protected by photoresist are etched away, defining the geometric shape of a polysilicon gate conductor.

The lateral width (i.e., the distance between opposed sidewall surfaces) of the gate conductor, which dictates the physical channel length of a transistor, is thus defined by the lateral width of an overlying photoresist layer. The minimum lateral dimension that can be achieved for a patterned photoresist layer is unfortunately limited by the resolution of the optical system (i.e., aligner or printer) used to project the image onto the photoresist. The term "resolution" describes the ability of an optical system to distinguish closely spaced objects.

Resolution in photolithography systems is limited by diffraction effects, which spread radiation from the illumination source into regions of the photoresist which are not directly exposed to the illumination source. Because of diffraction effects, there is a minimum distance beyond which even a geometrically perfect lens cannot resolve two points. In other words, when two points are less than a minimum distance from each other, the two points cannot be resolved by the lithography system. The diffraction patterns associated with each point overlap each other to such an extent that the two points cannot be effectively differentiated. The resolution of a lens depends on the wavelength of the illumination source and the numerical aperture of the lens. Rayleigh's criteria defines two images as being resolvable when the intensity between them drops to 80% of the image intensity. This criteria is satisfied when $2d=0.61\lambda/NA$, where $2d$ is the distance separating two images, $\lambda$ is the wavelength of the radiation, and NA is the numerical aperture of the lens. Thus, for a given photolithography system, Rayleigh's criteria predicts a threshold. Beyond this photolithography threshold, the features patterned upon a masking plate may be skewed, enlarged, shortened, or otherwise incorrectly printed onto the photoresist.

It would be advantageous to develop a technique for manufacturing a transistor in which the channel length of the transistor is reduced to provide for high-frequency operation of an integrated circuit employing the transistor. More specifically, a process is needed in which the lateral width of the gate conductor and underlying channel length are no longer dictated by the resolution of photolithography systems.

SUMMARY OF THE INVENTION

The problems outlined above are overcome by laterally diffusing a nitrogen implant to shrink the channel length of a transistor below the photolithography threshold. Controlled diffusion of nitrogen implanted into select regions of a gate conductor layer can be used to adjust the thickness of a gate conductor formed from that layer, thereby reducing the lateral dimension of the underlying channel length. Because the diffusion parameters for impurities in silicon and polysilicon can be readily calculated, it is possible to accurately control the amount of diffusion to tailor channel lengths.

According to one embodiment, a method is presented for fabricating a transistor by defining an ultra-short channel length in an active region of a semiconductor substrate. The ultra-short channel length is brought about by laterally diffusing a nitrogen implant in select regions of a gate conductor layer formed over the active region. More specifically, a semiconductor substrate is provided. The semiconductor substrate is preferably single crystal silicon lightly doped with p-type or n-type dopant species. One or more layers of gate dielectric can be formed over the semiconductor substrate. In one embodiment, a single gate oxide layer is preferably formed over the semiconductor substrate. The gate oxide layer may be thermally grown or deposited. A gate conductor layer is then formed over the gate oxide layer. Polycrystalline silicon is a suitable material for the gate conductor layer. The upper surface of the gate conductor layer includes a future gate conductor area laterally bounded by a spaced pair of target areas. Photoresist is then deposited over the gate conductor layer. The photoresist is patterned to expose the spaced pair of target areas on the upper surface of the gate conductor layer leaving only the future gate conductor area covered by photoresist.

After patterning the photoresist, nitrogen is implanted into the spaced pair of target areas to form a spaced pair of nitrogen bearing regions within the gate conductor layer. The formation of the nitrogen bearing regions is suitably accomplished by implanting a nitrogen containing molecule such as N, $N_2$, NO, $NF_3$, $N_2O$, $NH_3$, or any other molecular species containing nitrogen. A shallow implant is sufficient to accomplish the objectives contemplated herein. Ideally the distribution of nitrogen within the nitrogen bearing regions has a peak concentration preferably in the range of approximately $1 \times 10^{13}$ to $1 \times 10^{19}$ atoms/$cm^3$, and more preferably in the range of approximately $1 \times 10^{15}$ to $1 \times 10^{19}$ atoms/$cm^3$. The lateral distance between the spaced pair of nitrogen bearing regions defines a first width of the intervening nitrogen free region in the gate conductor layer. This first width is determined by the patterning of the photoresist. The nitrogen free region is formed under the future gate conductor area. The gate conductor will eventually be formed from this nitrogen free region. Following the nitrogen implantation and the removal of the remaining photoresist, the entire semiconductor topography is heated, preferably with a rapid anneal cycle, to laterally diffuse the nitrogen implants. The anneal causes the nitrogen in the nitrogen bearing regions to partially diffuse into the nitrogen free region resulting in a spaced pair of nitrogen diffused regions. The lateral distance between the spaced pair of nitrogen diffused regions defines a second width of the nitrogen free region less than the first width. Thus, where the first width is set at the minimum resolvable photolithography limit, lateral diffusion of the nitrogen implants necessitates that the second width will fall below the photolithography threshold. The anneal is preferably a rapid thermal process, carried out at a temperature of approximately 900 to 1100° C. for a duration of less than approximately 5 minutes. The precise temperature and anneal time vary depending on the desired channel length. Diffusion characteristics of nitrogen in polysilicon are well known making it possible to calculate a temperature and anneal duration to achieve a specific gate conductor width and underlying channel length.

The spaced pair of nitrogen diffused regions are removed along with any underlying nitrogen free portions of the gate conductor layer to form a nitrogen free gate conductor having a channel length equal to the second width. In a preferred embodiment, an oxide mask is used to align an etch of the exposed regions of the gate conductor layer. Formation of the oxide mask entails thermally oxidizing the gate conductor layer to grow a variable thickness oxide layer over the upper surface of the gate conductor layer. The thermal oxidation can be carried out in a dry or wet oxygen ambient. Because nitrogen drastically slows oxide growth, a first oxide thickness will grow over the spaced pair of diffused nitrogen regions and a second oxide thickness will grow over the nitrogen free region, wherein the second thickness is greater than the first thickness. The oxide mask is then formed by anisotropically etching the oxide layer to expose the upper surface of the spaced pair of diffused nitrogen regions, thereby leaving a remaining oxide layer only over the nitrogen free region. Using the remaining oxide layer as the oxide mask, the exposed portions of the gate conductor layer can be etched away to leave a gate conductor having a channel length equal to the second width.

In an alternative embodiment, the annealing step and the thermal oxidation step can be combined by performing anneal in an oxygen containing ambient. Combination of the anneal and thermal oxidation is possible because nitrogen diffuses faster in polysilicon than the polysilicon oxidizes. The additional diffusion of the nitrogen implant due to thermal oxidation can be readily accounted for in precisely calculating the ultimate gate conductor width and underlying channel length.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1:
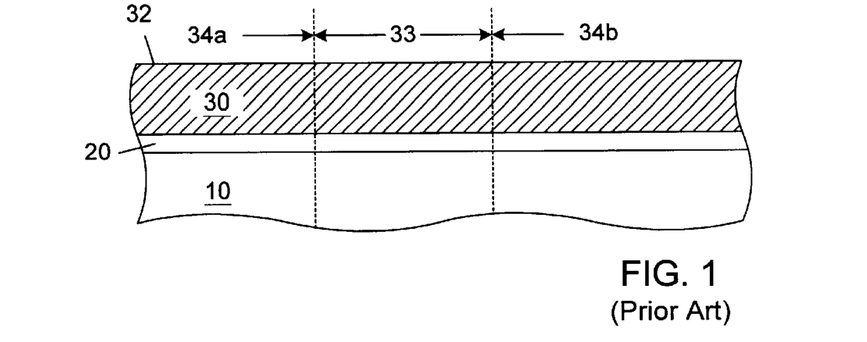
FIG. 1 is a partial cross-sectional view of semiconductor substrate having a superjacent gate oxide layer and gate conductor layer formed thereon showing a future gate conductor area laterally bounded by a pair of target areas.

Turning now to the drawings, FIG. 1 shows gate dielectric layer 20 formed on an upper surface of semiconductor substrate 10. An ideal material for semiconductor substrate 10 is lightly doped p-type or n-type single crystal silicon. In a preferred embodiment, gate dielectric layer 20 is a single gate oxide layer. The gate oxide layer may include thermally grown silicon dioxide. Alternatively, the gate oxide layer may include silicon dioxide formed by deposition from a TEOS source or a silane and oxygen bearing source. Yet another embodiment contemplates that gate dielectric layer 20 includes multiple layers, such as a silicon nitride layer deposited over an oxide layer.

A gate conductor layer 30 is then formed upon gate dielectric layer 20. Gate conductor layer 30 may include polycrystalline silicon ("polysilicon"). In the presently preferred embodiment, gate conductor layer 30 is heavily doped polysilicon. In alternative embodiments, gate conductor layer 30 may include a combination of any or all of polysilicon, aluminum, tungsten, titanium, or other suitable conducting material. The formation of gate conductor layer 30 upon gate dielectric layer 20 typically includes a chemical vapor deposition of polysilicon at a pressure of less than approximately 2 torrs and at a temperature maintained between approximately 500 to 600° C. Although not shown in FIG. 1, an impurity distribution may be introduced into gate conductor layer 30 to adjust the resistivity of the gate conductor material. Impurities such as phosphorous, boron, or arsenic are commonly used for this purpose. The dotted lines present in FIG. 1 oriented transverse to upper surface 32 of gate conductor layer 30 indicate future gate conductor area 33 laterally bounded by spaced pair of target areas 34a and 34b. In a subsequent step, nitrogen will be implanted into the spaced pair of target areas leaving the region of gate conductor layer 30 underlying future conductor area 33 substantially nitrogen free. A gate conductor for a transistor will then be formed out of a portion of this nitrogen free region of gate conductor layer 30.

Figure 2:
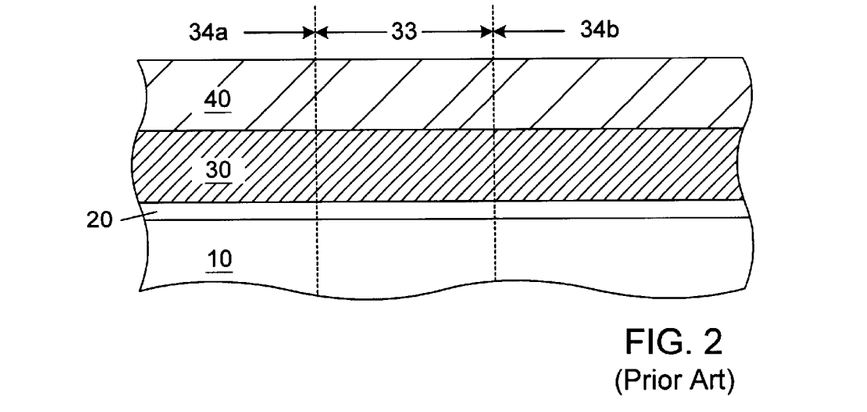
FIG. 2 is a processing step subsequent to FIG. 1 in which a layer of photoresist is deposited over the gate conductor layer.

In FIG. 2, photoresist layer 40 is formed upon gate conductor layer 30. Photoresist layer 40 is preferably deposited using chemical vapor deposition. The deposition of photoresist is well known.

Figure 3:
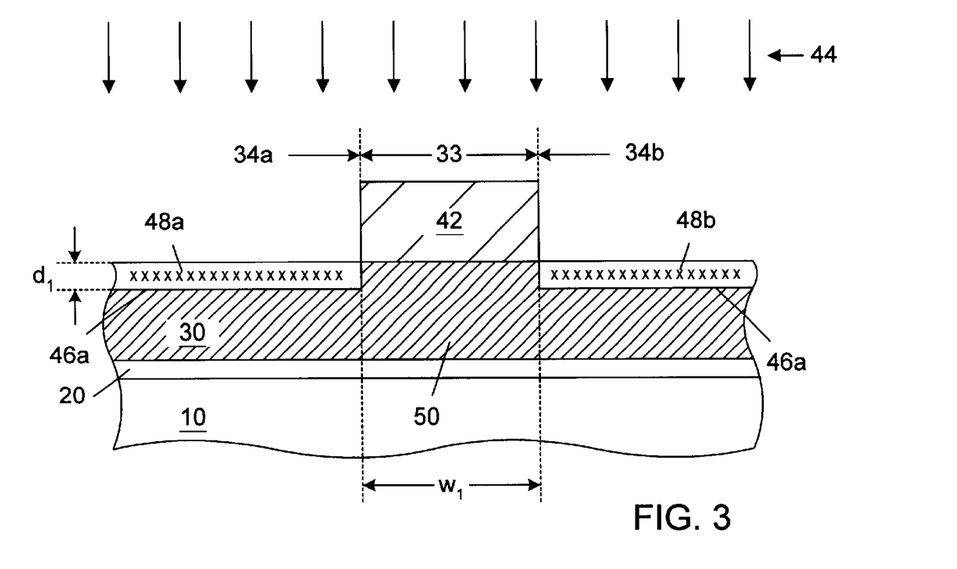
FIG. 3 is a processing step subsequent to FIG. 2 in which the photoresist is patterned and nitrogen is implanted into the spaced pair of target areas according to one embodiment hereof, to form a spaced pair of nitrogen bearing regions and a nitrogen free region.

Moving to FIG. 3, photoresist layer 40 is selectively patterned and removed to expose spaced pair of target areas 34a and 34b leaving photoresist mask 42 covering future gate conductor area 33. After the patterning of photoresist layer 40 is completed, nitrogen is implanted into target areas 34a and 34b via nitrogen implant 44, thereby forming spaced pair of nitrogen bearing regions 46a and 46b in gate conductor layer 30. Spaced pair of nitrogen bearing regions 46a and 46b is aligned with spaced pair of target areas 34a and 34b. Nitrogen distributions 48a and 48b present in nitrogen bearing regions 46a and 46b are represented by the "x's." The implant energy and dose are preferably adjusted such that the depth of nitrogen implant 44 is $d_1/2$. The implant depth, $d_1/2$, is measured from upper surface 32 of gate conductor layer 30 to the peak concentration of nitrogen distribution 48a or 48b. Thus, assuming a symmetric implant profile, the thickness of nitrogen bearing regions 46a and 46b is equal to $d_1$. Nitrogen implant 44 may extend to any depth in gate conductor layer 30 into the gate dielectric layer 20; however, a shallow implant is sufficient to accomplish the objectives of the present invention. Ideally nitrogen distributions 48a and 48b have peak concentrations in the range of approximately $1\times10^{13}$ to $1\times10^{19}$ atoms/cm$^3$, and more preferably in the range of approximately $1\times10^{15}$ to $1\times10^{19}$ atoms/cm$^3$ (or molecules/cm$^3$ in the case where the implant is a molecular species). The formation of nitrogen bearing regions 46a and 46b is suitably accomplished by implanting a nitrogen containing molecule such as N, $N_2$, NO, $NF_3$, $N_2O$, $NH_3$, or any other molecular species containing nitrogen. The lateral distance between spaced pair of nitrogen bearing regions 46a and 46b defines nitrogen free region 50 in gate conductor layer 30 having a first width $w_1$. The value of $w_1$ is equal to the width of photoresist mask 42, which is determined by the patterning of photoresist layer 40. Nitrogen free region 50 is formed under the future gate conductor area 33. The gate conductor will eventually be formed from a reduced portion of nitrogen free region 50.

Figure 4:
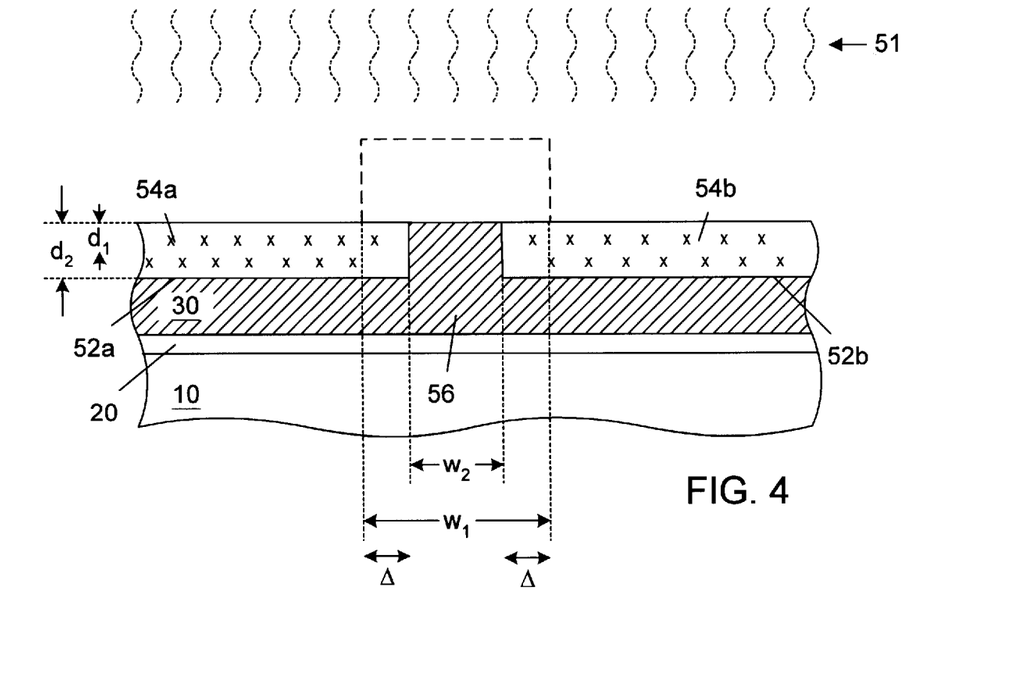
FIG. 4 is a processing step subsequent to FIG. 3 in which an anneal diffuses the nitrogen implants to form a spaced pair of diffused nitrogen regions, thereby reducing the width of the nitrogen free region.

Turning to FIG. 4, photoresist mask 42 is stripped from upper surface 32 of gate conductor layer 30. Following the removal of photoresist mask 42, a heating step is performed. In a preferred embodiment, the heating step is anneal 51. Heating nitrogen bearing regions 46a and 46b causes the nitrogen implanted therein to diffuse leading to the formation of the spaced pair of diffused nitrogen regions 52a and 52b. Diffusion through gate conductor layer 30 proceeds both lateral and transverse to the upper surface of gate conductor layer 30. The diffusion of nitrogen distributions 48a and 48b results in the formation of diffused nitrogen distributions 54a and 54b. The thickness of either of the spaced pair of diffused nitrogen regions 52a or 52b increases to $d_2$. Lateral diffusion causes diffusion regions 52a and 52b to encroach a diffusion distance $\Delta$ into nitrogen free region 50. The lateral distance between spaced pair of diffused nitrogen regions 52a and 52b defines reduced-width nitrogen free region 56 having a second width, $w_2=w_1-\Delta$. Because small transistor geometries are required to build more complex integrated circuits, the value of $w_1$ is preferably set at the minimum resolvable spacing possible using photolithography. It follows that $w_2$ will be less than the photolithography threshold. As will be seen below, the width of the gate conductor formed according to the present invention will be $w_2$. Thus, one advantage of the method disclosed herein is manufacturing gate conductors with widths below the photolithography threshold.

Anneal 51 is preferably a rapid thermal process carried out at a temperature of approximately 900 to 1100° C. for less than approximately 5 minutes. Anneal 51 is ideally performed in an RTA chamber. Alternatively, anneal 51 may be performed in a diffusion tube using an inert ambient such as argon. It is also possible to carry out anneal 51 in a conventional oven. The precise temperature and duration of anneal 51 will depend on the desired value of the channel length, which according to the present embodiment will be equal to $w_2$. Diffusion characteristics of nitrogen in silicon and polysilicon are well known making it possible to reliably calculate an anneal temperature and duration to achieve a specific value of $w_2$.

Figure 5:
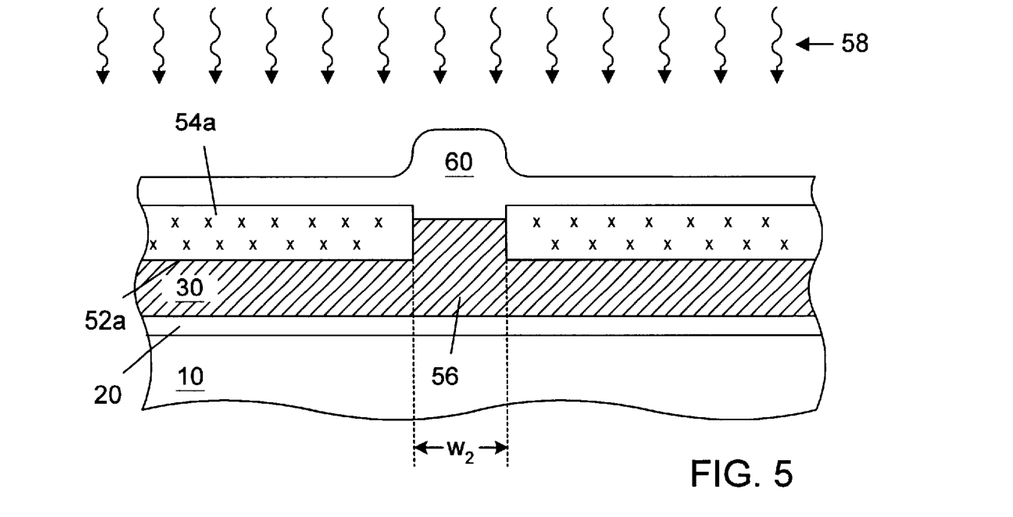
FIG. 5 is a processing step subsequent to FIG. 4 in which a thermal oxidation grows a variable thickness oxide layer over the gate conductor layer.

FIG. 5 shows a processing step subsequent to the steps illustrated in FIG. 4. Thermal oxidation 58 results in the growth of variable thickness oxide layer 60 over upper surface 32 of gate conductor layer 30. The basic mechanism for the oxidation of silicon is well understood, and the same model can be applied to understand the oxidation of polysilicon, which is the preferred material for gate conductor layer 30. Oxidation takes place at the silicon/oxide interface. As the oxide grows, silicon is consumed and the interface moves into the silicon. Thus, the vertical dimension of nitrogen free region 56 will be reduced as is shown in FIG. 5. However, the introduction of nitrogen into silicon or polysilicon retards the rate of oxidation. As a result of these competing effects, variable thickness oxide layer 60 will have a first oxide thickness grown over diffused nitrogen regions 52a and 52b and a second oxide thickness, which is greater than the first oxide thickness, grown over nitrogen free region 56. The oxidation rate in the nitrogenated regions of gate conductor layer 30 is believed to correspond to the amount of nitrogen present in those regions. Thus, regulating the dosage in nitrogen implant 44 controls the oxidation rate within diffused nitrogen regions 52a and 52b.

Thermal oxidation 58 may be performed in a low temperature regime, with temperatures in the range of 600 to 900° C. or in a high temperature regime, with temperatures in the range of 900 to 1100° C., and can be performed in either an $O_2$ (dry) or an $H_2O$ (wet) ambient. The duration of the oxidation will depend on the temperature and pressure selected. The use of high pressure significantly increases the oxide growth rate. Thus, oxidation rates in the low temperature regime can be raised by increasing the pressure. One advantage of using a low temperature oxidation is to limit further diffusion of the nitrogen in diffused nitrogen regions 52a and 52b. However, high pressure systems can be costly and raise safety issues.

If thermal oxidation 58 is performed in the high temperature regime, it may be necessary to account for additional diffusion of the nitrogen into reduced-width nitrogen free region 56. In an alternative embodiment not shown, diffusion caused by thermal oxidation 58 extends diffused nitrogen regions 52a and 52b a diffusion distance $\Delta'$ into reduced-width nitrogen free region 56 thereby shrinking the width of nitrogen region 56 to $w_2'=w_2-\Delta$. The value $\Delta'$ can be readily calculated given the temperature at which thermal oxidation 58 is carried out. This makes it possible to use thermal oxidation 58 as a second step for laterally diffusing the nitrogen implant to controllably bring the ultimate gate conductor width and underlying channel length below the photolithography threshold.

Figure 6:
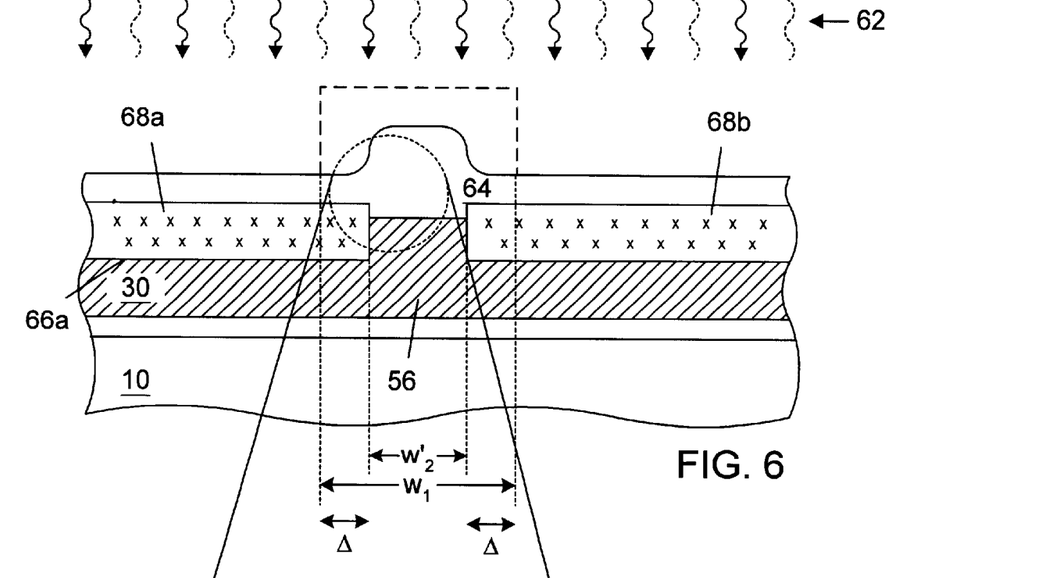
FIG. 6 shows an alternative embodiment of the invention in which the anneal and thermal oxidation steps are combined resulting in a structure comparable to the one shown in FIG. 5.
Figure 6A:
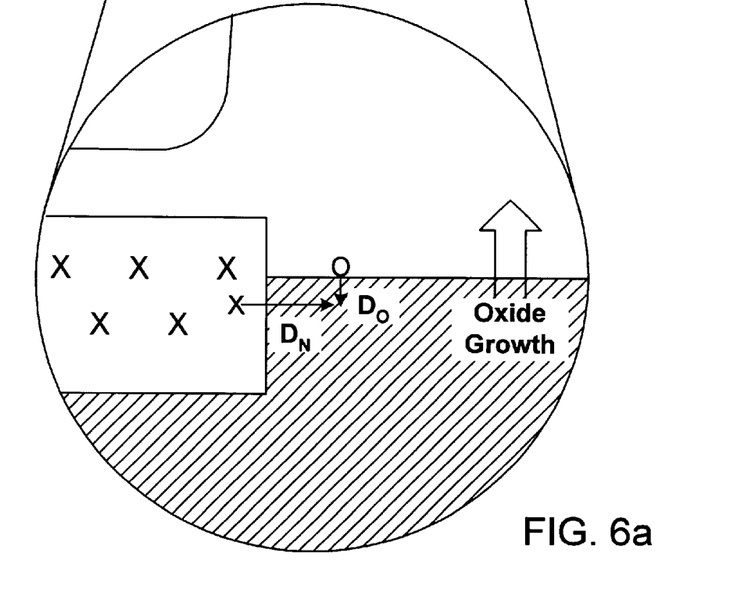
FIG. 6a shows a blow up detail of a region of FIG. 6 illustrating how lateral diffusion of nitrogen competes with the oxidation of the gate conductor layer.

Yet another embodiment is shown in FIG. 6 in which the anneal and thermal oxidation are combined by conducting an anneal in the presence of an oxygen containing ambient. FIG. 6 shows a processing step subsequent to FIG. 3 in which high temperature thermal oxidation 62 is performed. Photoresist mask 42 is shown in phantom. High temperature thermal oxidation 62 is preferably carried out at a temperature of 1000 to 1150° C. and can be a wet or dry oxidation. High temperature thermal oxidation 62 results in: 1.) growing variable thickness oxide layer 64 over upper surface 32 of gate conductor layer 30 and 2.) causing the nitrogen implanted in nitrogen bearing regions 46a and 46b to diffuse leading to the formation of the spaced pair of diffused nitrogen regions 66a and 66b, having diffused nitrogen distributions 68a and 68b. The competition between these two effects is depicted in the blow up detail presented in FIG. 6a. Oxide layer 64 grows as oxygen bearing molecules, labeled in FIG. 6a with diffusion constant $D_O$, diffuse through oxide layer 64 until reaching silicon/oxide interface 71 where they react with silicon present at the interface. Oxide growth generally proceeds outward from silicon/oxide interface 71 as silicon is consumed at the interface. Nitrogen, labeled with diffusion constant $D_N$, is pictured diffusing through gate conductor layer 30. Lateral diffusion of the nitrogen dominates over oxide growth and causes diffusion regions 66a and 66b to encroach a diffusion distance $\Delta''$ into nitrogen free region 50. The lateral distance between spaced pair of diffused nitrogen regions 66a and 66b defines reduced-width nitrogen free region 70 having a second width, $w_2''=w^1-\Delta''$. The additional diffusion of the nitrogen implant due to thermal oxidation can be readily accounted for in precisely calculating the ultimate gate conductor width and underlying channel length.

Figure 7:
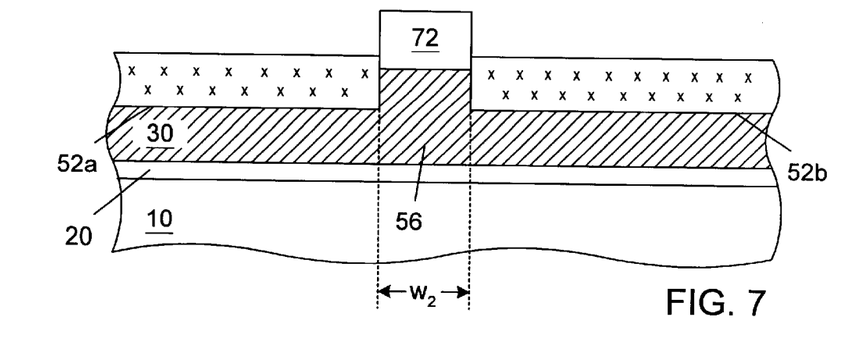
FIG. 7 is a processing step subsequent to either FIG. 5 or FIG. 6 in which a blanket anisotropic etch of the variable thickness oxide layer exposes the spaced pair of diffused nitrogen regions leaving an oxide mask over the reduced-width nitrogen free region.

The remaining steps in the disclosed method can be performed subsequent to any of the preceding embodiments. For convenience, and by way of illustration, FIGS. 7–10 are shown as steps subsequent to FIG. 5. In particular, FIG. 7 shows oxide mask 72 resulting from the anisotropic etch of variable thickness oxide layer 60. Anisotropic etching is a commonly used technique for selectively removing material along a preferred direction. Because the thickness of oxide layer 60 overlying diffused nitrogen regions 52a and 52b is less than the oxide thickness overlying reduced-width nitrogen region 56, anisotropic etching of oxide layer 60 in the vertical direction can be continued until diffused nitrogen regions 52a and 52b are exposed, thereby leaving the remaining oxide layer 60, i.e. oxide mask 72, aligned with reduced-width nitrogen free region 72.

Figure 8:
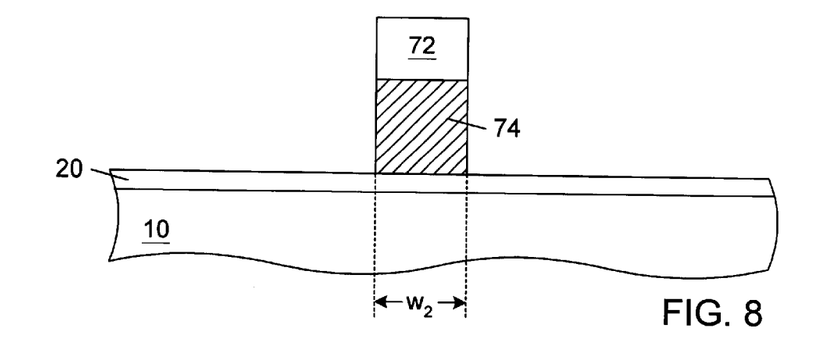
FIG. 8 is a processing step subsequent to FIG. 7 in which the unmasked gate conductor layer is removed leaving an ultra-short gate conductor and channel aligned beneath the gate conductor.

In FIG. 8, diffused nitrogen regions 52a and 52b, and the nitrogen free portions of gate conductor layer 30 underlying those regions are removed, leaving gate conductor 74 underlying oxide mask 72. The width of gate conductor 74 is $w_2$, as determined by the lateral diffusion of the nitrogen implant. In the case where gate conductor 30 is made of polysilicon, removal is accomplished by a polysilicon etch, wherein a preferred etch process exhibits excellent line width control, a high degree of anisotropy, and selectivity to the silicon dioxide in gate dielectric layer 20. Suitable polysilicon etch process are widely known to those skilled in the art.

Figure 9:
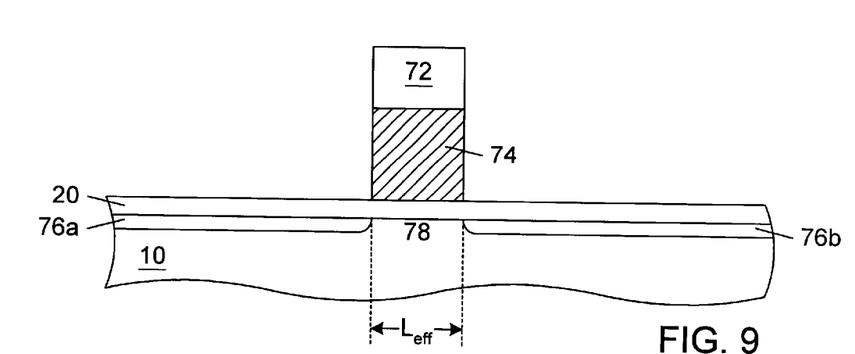
FIG. 9 is a processing step subsequent to FIG. 8 in which LDD regions are formed in the substrate adjacent to the gate conductor.

FIG. 9 depicts a processing step subsequent to FIG. 8, wherein oxide mask 72 serves as a mask for self-aligning an implant of either a p-type or n-type dopant species. In regions not covered by oxide mask 72, the implant species is implanted into substrate 10 to a first dopant depth and a first dopant concentration. If the implant species is p-type, then preferably the dopant includes boron, and if the implant species is n-type, then the dopant preferably includes phosphorous. The first dopant depth and first dopant concentration is preferably chosen so that the regions being implanted form lightly doped drain (LDD) regions 76a and 76b. LDD region 76a represents the drain side of channel 78, and LDD region 76b represents the source side of channel 78. The length of channel 78 underlying gate conductor 74 and laterally bounded by LDD regions 76a and 76b has an initial effective channel length, $L_{eff}$, equal to $w_2$, which is the width of gate conductor 74 as determined by the lateral diffusion of the nitrogen implant. An anneal is typically performed after implanting impurities into a semiconductor substrate for a variety of well known reasons including electrical activation of the implants and repairing damage to the crystal lattice. Rapid thermal processing (RTP) is the preferred method for a post-implant anneal because RTP avoids extensive dopant redistribution during the anneal. Nevertheless, any dopant redistribution occurring during an anneal following formation of LDD or source/drain regions will make $L_{eff}$ smaller than $w_2$, but any such changes can be factored into the presently disclosed formulation in a calculable manner.

Figure 10:
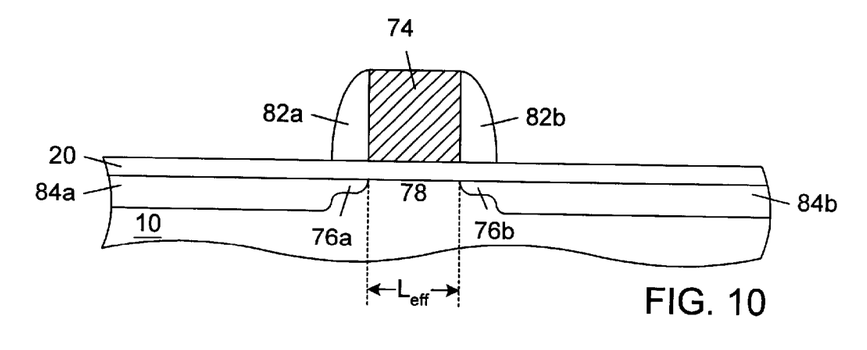
FIG. 10 is a processing step subsequent to FIG. 9 in which opposed sidewall spacers are used to form source/drain regions in the substrate.

FIG. 10 shows a processing step subsequent to FIG. 9, in which source/drain dopants are implanted into substrate 10 a spaced distance from either side of gate conductor 74. Following the removal of oxide mask 72, a spacer material is conformally deposited over the entire topography, including gate conductor 74 and the areas overlying LDD regions 76a and 76b. The spacer material then undergoes an anisotropic etch to form spacers 82a and 82b on opposed sidewalls of gate conductor 74. In an alternative embodiment not pictured, oxide mask 72 is not removed prior to the deposition of the spacer material. After formation of spacers 82a and 82b, source/drain regions 84a and 84b are formed by implanting either n-type or p-type species into substrate 10. During source/drain implants, gate conductor 74 and spacers 82a and 82b serve to mask the implants from substrate 10. The source/drain implants are of the same species as the LDD implants; however, the source/drain implants are of a greater dopant concentration and implanted to a greater depth than the LDD implants. For an NMOS device, the LDD and source/drain implants are n-type; whereas, a PMOS device uses p-type LDD and source/drain implants.

It will be appreciated by those skilled in the art having the benefit of this disclosure that the disclosed method is believed to be capable of forming MOS transistors having ultra-short channel lengths. Furthermore, it is also to be understood that the form of the invention shown and described is to be taken as exemplary, presently preferred embodiments. Various modifications and changes may be made to each and every processing step without departing from the spirit and the scope of the invention as set forth in the claims. It is intended that the following claims be interpreted to embrace all such modifications and changes and, accordingly, the specification and drawings are being regarded in an illustrative rather than a restrictive sense.

What is claimed is:

1. A semiconductor structure, comprising:
   a semiconductor substrate with a superjacent gate oxide layer;
   a gate conductor layer arranged upon said gate oxide layer; and
   a nitrogen free region of said gate conductor layer laterally bounded by a spaced pair of diffused nitrogen regions in said gate conductor layer, wherein said nitrogen free region defines a gate conductor and extends to the upper surface of the gate conducter layer.

2. The semiconductor structure of claim 1, wherein the gate conductor layer comprises polysilicon.

3. The semiconductor structure of claim 1, further comprising a variable thickness oxide layer above said gate conductor layer, wherein said variable thickness oxide layer comprises a first thickness over said spaced pair of diffused nitrogen regions and a second thickness greater than said first thickness over said nitrogen free region.

4. The semiconductor structure of claim 3, wherein said variable thickness oxide is a thermal oxide.

5. The semiconductor structure of claim 1, wherein said spaced pair of diffused nitrogen regions each extend within the gate conductor layer to a depth less than a total thickness of the gate conductor layer.

6. The semiconductor structure of claim 5, wherein said spaced pair of diffused nitrogen regions comprises a peak nitrogen concentration between approximately $1 \times 10^{13}$ and approximately $1 \times 10^{19}$ atoms/cm$^3$.

7. The semiconductor structure of claim 5, wherein said spaced pair of diffused nitrogen regions comprises a peak nitrogen concentration between approximately $1 \times 10^{13}$ and approximately $1 \times 10^{19}$ molecules/cm$^3$.

8. The semiconductor structure of claim 1, further comprising an oxide mask arranged above only the nitrogen free region such that upper surfaces of the gate conductor within the spaced pair of diffused nitrogen regions are exposed.

9. The semiconductor structure of claim 8, wherein the lateral boundaries of the oxide mask are aligned with the lateral boundaries of the nitrogen free region.

10. The semiconductor structure of claim 1, wherein the lateral width of said nitrogen free region further defines the lateral width of said gate conductor.

11. A semiconductor structure, comprising:
    a semiconductor substrate with a superjacent gate oxide layer;
    a gate conductor layer arranged upon said gate oxide layer; and
    a nitrogen free region of said gate conductor layer laterally bounded by a spaced pair of diffused nitrogen regions in said gate conductor layer, wherein said nitrogen free region defines a gate conductor and extends to the upper surface of the gate conductor layer, and wherein the lateral width of said nitrogen free region further defines the lateral width of said gate conductor.

12. A semiconductor structure, comprising:
    a semiconductor substrate with a superjacent gate oxide layer,
    a gate conductor layer arranged upon said gate oxide layer; and
    a nitrogen free region of said gate conductor layer laterally bounded by a spaced pair of diffused nitrogen regions in said gate conductor layer, wherein said nitrogen free region defines a gate conductor layer and extends to the upper surface of the gate conductor layer, and wherein said spaced pair of diffused nitrogen regions each extend within said gate conductor layer to a depth less than a total thickness of said gate conductor layer.

* * * * *

UNITED STATES PATENT AND TRADEMARK OFFICE
CERTIFICATE OF CORRECTION

PATENT NO. : 6,268,634 B1
DATED : July 31, 2001
INVENTOR(S) : Gardner et al.

Page 1 of 1

It is certified that error appears in the above-identified patent and that said Letters Patent is hereby corrected as shown below:

<u>Title page,</u>
Please delete the following:
"Item [75] Inventors: Mark I. Gardner, Cedar Creek; H. Jim Eulford, Jr.; Charles E. May, both of Austin, all of TX (US)"

and substitute therefor:
-- Item [75] Inventors: Mark I. Gardner, Cedar Creek; H. Jim Fulford, Jr.; Charles E. May, both of Austin, all of TX (US) --

Signed and Sealed this

Twenty-sixth Day of February, 2002

*Attest:*

JAMES E. ROGAN
*Attesting Officer*   *Director of the United States Patent and Trademark Office*